United States Patent
Xie

(10) Patent No.: US 8,438,439 B2
(45) Date of Patent: May 7, 2013

(54) INTEGRATED CIRCUIT HAVING A SCAN CHAIN AND TESTING METHOD FOR A CHIP

(75) Inventor: Wuhong Xie, Zhuhai (CN)

(73) Assignee: Actions Semiconductor Co., Ltd., Zhuhai (CN)

( * ) Notice: Subject to any disclaimer, the term of this patent is extended or adjusted under 35 U.S.C. 154(b) by 0 days.

(21) Appl. No.: 13/359,015

(22) Filed: Jan. 26, 2012

(65) Prior Publication Data

US 2012/0124437 A1     May 17, 2012

Related U.S. Application Data

(63) Continuation of application No. PCT/CN2010/076448, filed on Aug. 30, 2010.

(30) Foreign Application Priority Data

Oct. 12, 2009   (CN) .......................... 2009 1 0110751

(51) Int. Cl.
*G01R 31/28*     (2006.01)
(52) U.S. Cl.
USPC ............. 714/726; 714/30; 714/724; 714/727; 714/729
(58) Field of Classification Search ........................ None
See application file for complete search history.

(56) References Cited

U.S. PATENT DOCUMENTS

| | | | |
|---|---|---|---|
| 6,848,067 B2 * | 1/2005 | Perner | 714/729 |
| 7,409,612 B2 * | 8/2008 | Van De Logt et al. | 714/727 |
| 2007/0150781 A1 * | 6/2007 | Chen et al. | 714/726 |
| 2007/0168799 A1 * | 7/2007 | Paglieri | 714/726 |
| 2008/0195346 A1 * | 8/2008 | Lin et al. | 702/119 |
| 2009/0070645 A1 * | 3/2009 | Chiang | 714/726 |

FOREIGN PATENT DOCUMENTS

| | | |
|---|---|---|
| CN | 1516015 | 7/2004 |
| CN | 1996035 | 7/2007 |
| CN | 1748154 | 3/2009 |
| CN | 101387685 | 3/2009 |

* cited by examiner

*Primary Examiner* — John Trimmings
(74) *Attorney, Agent, or Firm* — Hamre, Schumann, Mueller & Larson, P.C.

(57) ABSTRACT

An IC having a scan chain and a testing method for a chip, comprising a first interface group, a second interface group and a scan data selector. The first interface group and the second interface group each comprise at least two input/output (I/O) interfaces which can be packaged as external pins of the IC. The I/O interfaces of the first interface group are connected to input terminals of the scan data selector in one-to-one correspondence, and an output terminal of the scan data selector is connected to a scan data input terminal of the scan chain. A scan data output terminal of the scan chain is connected to the I/O interfaces of the second interface group.

11 Claims, 10 Drawing Sheets

INTEGRATED CIRCUIT HAVING A SCAN CHAIN AND TESTING METHOD FOR A CHIP

BACKGROUND OF THE INVENTION

1. Technical Field

The present invention relates to the technical field of integrated circuits (ICs), and more particularly, to an IC having a scan chain and a testing method for a chip.

2. Description of Related Art

A method commonly used to test a digital logic section of a chip comprised of large-scale integrated circuits (LSICs) is the scan chain test. A scan chain consists of scan registers. A general structure of a non-scan register is as shown in FIG. 1A. At a rising edge of a clock signal (clk), a data value from a data input terminal (d) is obtained at a data output terminal (q) of the register and is kept unchanged until the next rising edge of the clock signal. Then, the data value is updated into a new data value of the data input terminal (d). A general structure of a scan register is as shown in FIG. 1B. In contrast to the non-scan register, the scan register additionally comprises a data input selector at the data input terminal. In a scan disabled status (i.e., scan_enable=0), the data input d' of the register is d. In a scan enabled status (i.e., scan_enable=1), the data input d' of the register becomes the scan data input scan_in; and at a rising edge of the clock signal (clk), the data value obtained at the output terminal (q/scan_out) of the register may be either d or scan_in depending on the value of the scan enable signal (scan_enable). By connecting the data output terminal q/scan_out of each scan register with the scan data input terminal scan_in of a next scan register in sequence, a long register bar can be formed, which is called a scan chain. FIG. 1C is an original design sketch before the scan chain is inserted, and FIG. 1D is a full-scan design sketch after the scan chain is inserted.

The registers in the scan chain feature scan controllability and scan observability. By controlling a clock signal and a scan enable signal connected to each of the scan registers and the first scan input signal (scan_in) connected to a chip pin, the Automatic Test Program Generation (ATPG) tool can control the value of the data output terminal of any of the scan registers in the whole scan chain; alternatively, the value of the data output terminal of any of the scan registers in the whole scan chain may be obtained according to the last scan output signal (scan_out) connected to a chip pin. Thus, in the scan enabled status (i.e., scan_enable=1), an initial value is set for the scan register; and when the scan chain is switched to the scan disabled status (i.e., scan_enable=0) (i.e., switched to the normal functional circuit of the digital circuit), the clock signal (clk) is allowed to experience a transition once so that the logic data input (d) in the functional circuit is latched to the output terminal (q/scan_out) of the register. Then, the register is switched back into the scan enabled status (scan_enable=1) to output the value latched in the register through shifting. By comparing the value with a known value that is ought to be obtained, it can be known whether the circuit has a defect caused in the manufacturing process.

Generally, in order to cater for different needs in the market, integrated circuits (ICs) might be packaged in forms of various types of packages. Then, in order to ensure that the scan chain test can be carried out on all types of packages, input/output (I/O) interfaces that are always packaged as external pins in each package type (i.e., an intersection set of I/O interfaces that are packaged as external pins in each package type) must be found and external pins corresponding to the intersection set are used as usable pins of the scan chain.

Referring to FIGS. 2A, 2B and 2C, three different package types of a same chip are shown therein respectively. As can be seen, only I/O interfaces io1, io2, io6, io7 are always packaged as external pins in each of the three package types. Then, in order to ensure that the scan chain test can be carried out on the chip of each of the package types, generally only external pins pin1, pin2, pin4, and pin5 corresponding to the I/O interfaces io1, io2, io6 and io7 after being packaged are used as usable pins of the scan chain. The structure of the scan chain is shown in FIG. 2D.

This method is feasible for packages whose functions are highly overlapped with each other. However, for packages whose functions vary greatly from each other, the number of I/O interfaces that can always be packaged as external pins in each type of package is very small; and correspondingly, the number of scan chains that can be inserted becomes very small, and in case of a large-scale design, the number of registers in each scan chain will be very large. Because of the fact that the larger the number of registers in a single scan chain is, the longer the testing time and the higher the testing cost will be, this method tends to considerably increase the testing cost and the testing time.

BRIEF SUMMARY OF THE INVENTION

Technical Problems

An objective of the present invention is to provide an IC having a scan chain, which is capable of reducing the testing time and the testing cost for the IC.

Another objective of the present invention is to provide a testing method for a chip.

Technical Solutions

An embodiment of the present invention is achieved as follows: an IC having a scan chain is provided, and the IC further comprises a first interface group, a second interface group and a scan data selector.

The first interface group and the second interface group each comprise at least two input/output (I/O) interfaces which can be packaged as external pins of the IC.

The I/O interfaces of the first interface group are connected to input terminals of the scan data selector in one-to-one correspondence, and an output terminal of the scan data selector is connected to a scan data input terminal of the scan chain.

A scan data output terminal of the scan chain is connected to the I/O interfaces of the second interface group.

The scan data selector is configured to, according to a package type indicating signal inputted to a control terminal thereof, select data in one of the I/O interfaces of the first interface group that corresponds to the package type indicating signal for output.

Another objective of the present invention is to provide an IC having a scan chain. The IC comprises a plurality of scan chain units, each of which comprises a first interface group, a second interface group, a scan chain and a scan data selector.

The first interface group and the second interface group each comprise at least two I/O interfaces which can be packaged as external pins of the IC.

The I/O interfaces of the first interface group are connected to input terminals of the scan data selector in one-to-one correspondence, and an output terminal of the scan data selector is connected to a scan data input terminal of the scan chain.

A scan data output terminal of the scan chain is connected to the I/O interfaces of the second interface group.

The scan data selector is configured to, according to a package type indicating signal inputted to a control terminal thereof, select data in one of the I/O interfaces of the first interface group that corresponds to the package type indicating signal for output.

A further objective of an embodiment of the present invention is to provide an IC having a scan chain. The IC further comprises a clock interface group and a clock signal selector.

The clock interface group comprises at least two I/O interfaces that can be packaged as external pins of the IC.

The I/O interfaces of the clock interface group are connected to input terminals of the clock signal selector in one-to-one correspondence, and an output terminal of the clock signal selector is connected to a scan clock input terminal of the scan chain.

The clock signal selector is configured to, according to a package type indicating signal inputted to a control terminal thereof, select a clock signal in one of the I/O interfaces of the clock interface group that corresponds to the package type indicating signal for output to the scan clock input terminal of the scan chain.

Yet a further objective of an embodiment of the present invention is to provide an IC having a scan chain. The IC further comprises an enable interface group and an enable signal selector.

The enable interface group comprises at least two I/O interfaces that can be packaged as external pins of the IC.

The I/O interfaces of the enable interface group are connected to input terminals of the enable signal selector in one-to-one correspondence, and an output terminal of the enable signal selector is connected to a scan enable input terminal of the scan chain.

The enable signal selector is configured to, according to a package type indicating signal inputted to a control terminal thereof, select an enable signal in one of the I/O interfaces of the enable interface group that corresponds to the package type indicating signal for output to the scan enable input terminal of the scan chain.

A further objective of an embodiment of the present invention is to provide a testing method for a chip. The chip comprises a first pin, a second pin, a scan chain, a first interface group, a second interface group and a scan data selector.

The first interface group and the second interface group each comprise at least two I/O interfaces, one of the I/O interfaces of the first interface group is connected to the first pin, and one of the I/O interfaces of the second interface group is connected to the second pin.

The I/O interfaces of the first interface group are connected to input terminals of the scan data selector in one-to-one correspondence, an output terminal of the scan data selector is connected to a scan data input terminal of the scan chain, and a scan data output terminal of the scan chain is connected to the I/O interfaces of the second interface group.

The testing method comprises:

inputting test input data from the first pin;

selecting, by the scan data selector, the test input data for input into the scan data input terminal according to package type information of the chip;

outputting test output data from the scan data output terminal by the scan chain in response to the test input data; and reading the test output data from the second pin.

Technical Benefits

In the embodiments of the present invention, the scan data selector, according to a package type indicating signal inputted to a control terminal thereof, selects data in one of the I/O interfaces of the first interface group that corresponds to the package type indicating signal for output to the I/O interfaces of the second interface group. Thereby, for various package types whose functions vary greatly from each other, the number of scan chains can be considerably increased so as to considerably reduce the testing cost for the IC and increase the testing efficiency for the IC.

DETAILED DESCRIPTION OF THE INVENTION

Hereinafter, the present invention will be further detailed in conjunction with the attached drawings and embodiments thereof in order to make the objectives, technical solutions and advantages of the present invention more apparent. It shall be appreciated that, the embodiments described herein are only intended to illustrate but not to limit the present invention.

In the embodiments of the present invention, the scan data selector, according to a package type indicating signal inputted to a control terminal thereof, selects data in one of the I/O interfaces of the first interface group that corresponds to the package type indicating signal for output to the I/O interfaces of the second interface group. Thereby, for various package types whose functions vary greatly from each other, the number of scan chains can be considerably increased so as to considerably reduce the testing cost for the IC and increase the testing efficiency for the IC.

Figure 1A:
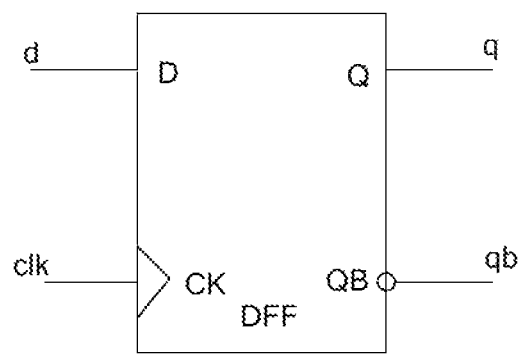
FIG. 1A is a schematic view illustrating a structure of a prior art non-scan register.
Figure 1B:
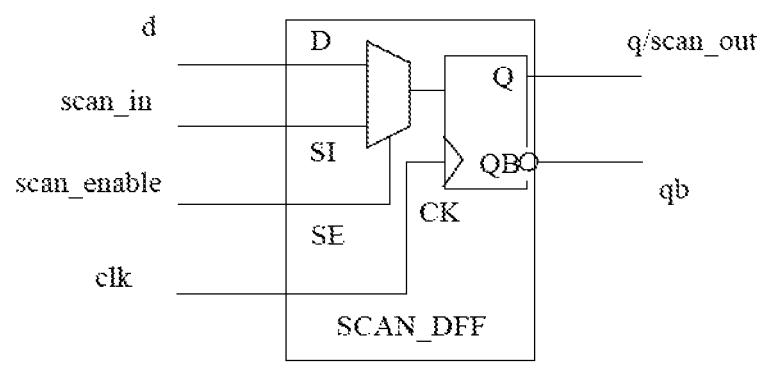
FIG. 1B is a schematic view illustrating a structure of a prior art scan register.
Figure 1C:
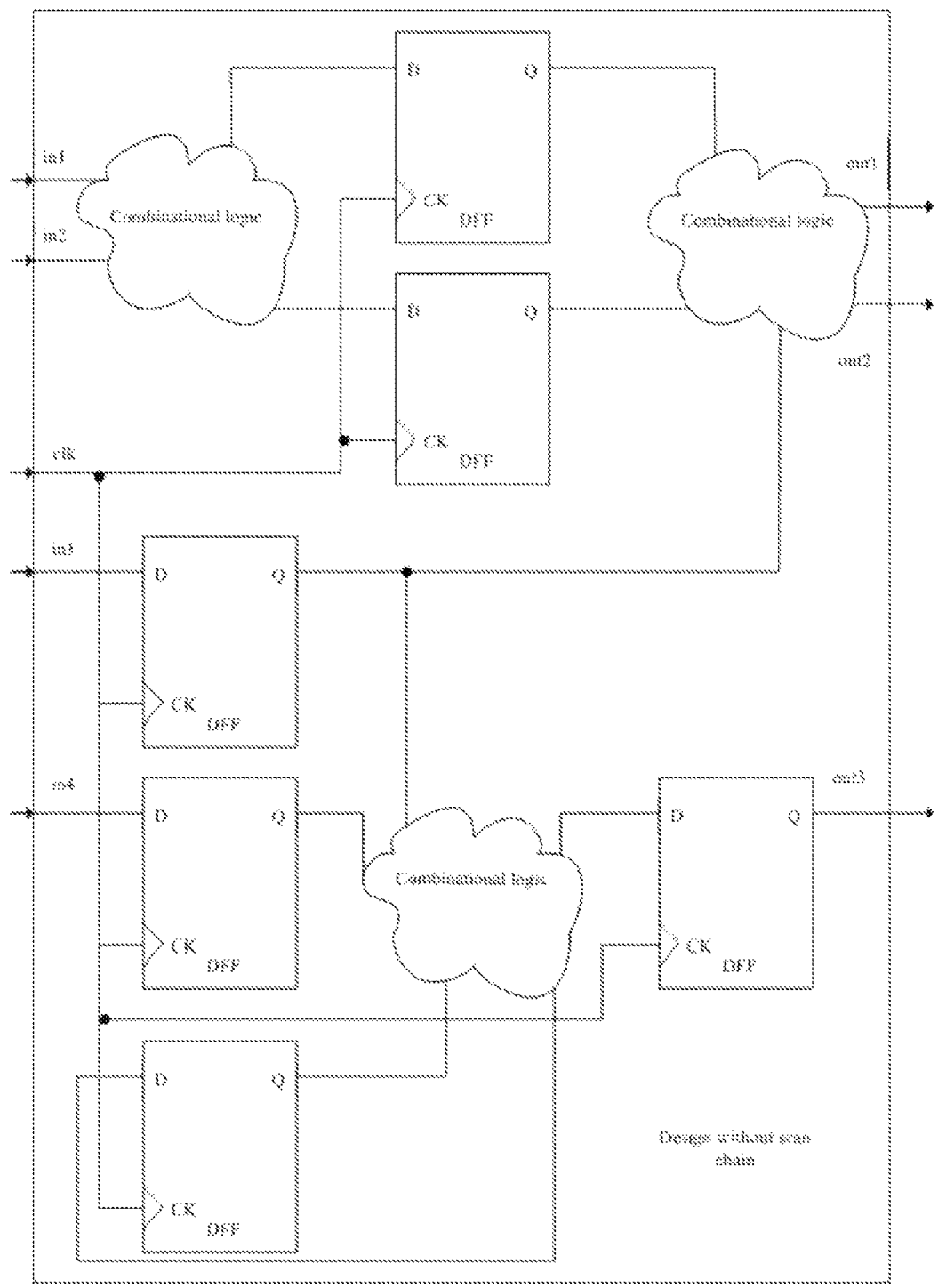
FIG. 1C is an original design sketch before a prior art scan chain is inserted.
Figure 1D:
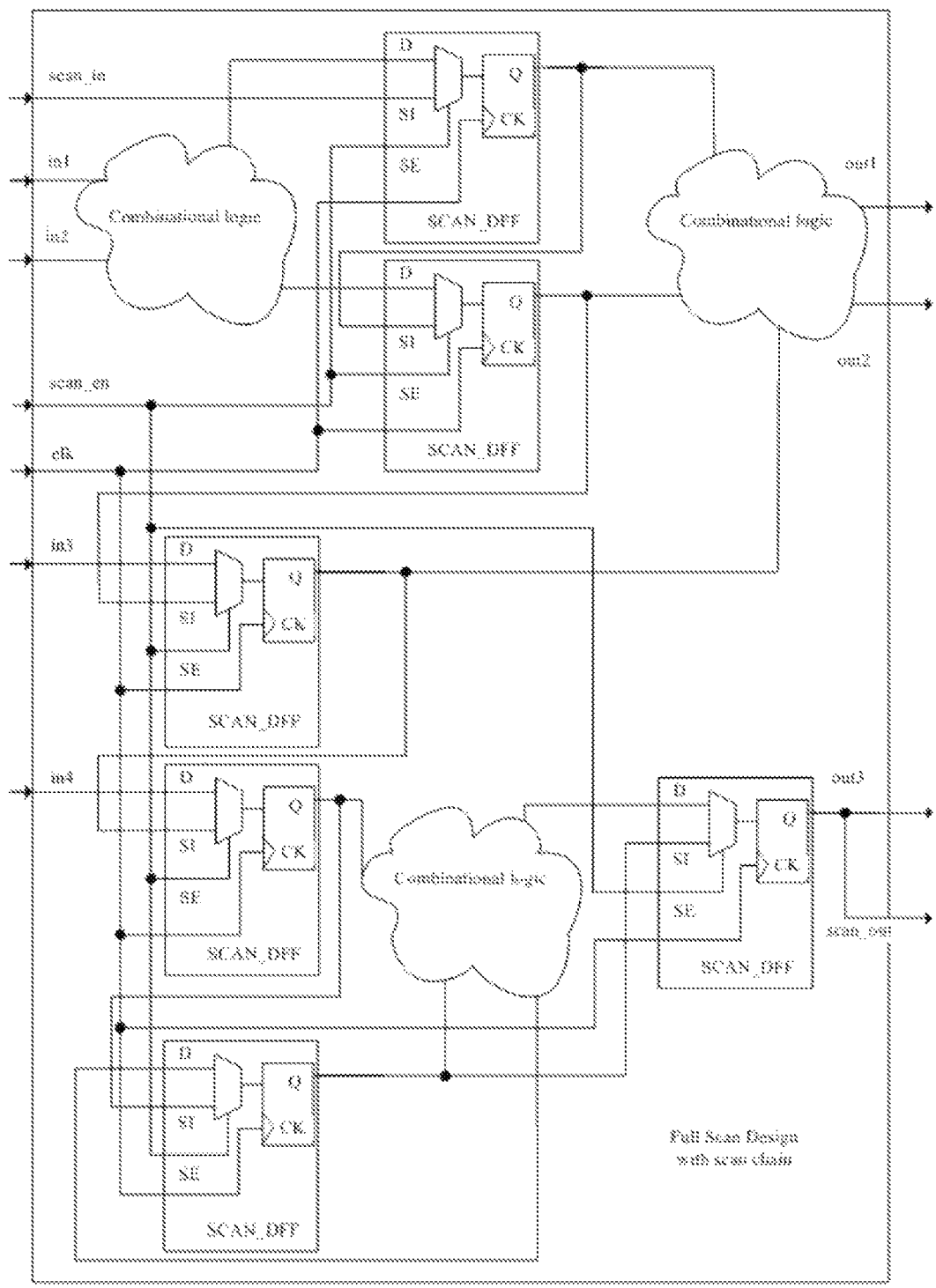
FIG. 1D is a full-scan design sketch after the prior art scan chain is inserted.
Figure 2A:
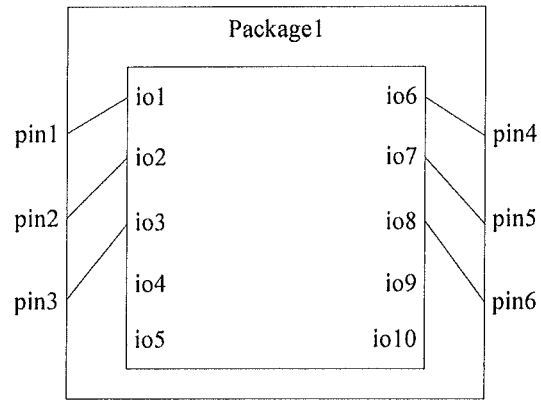
FIGS. 2A, 2B and 2C are schematic views illustrating three different package types of a same IC in the prior art.
Figure 2B:
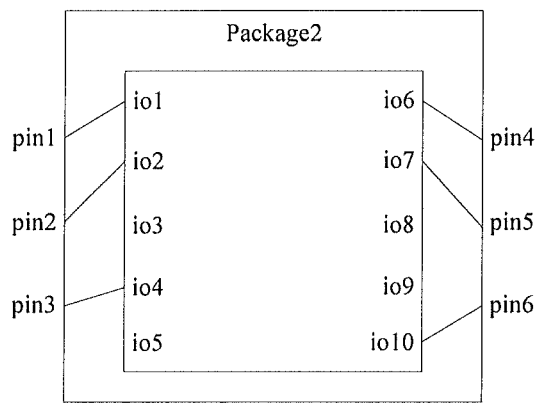
Figure 2C:
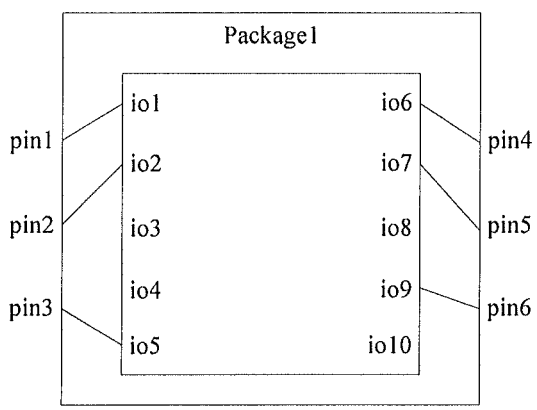
Figure 2D:
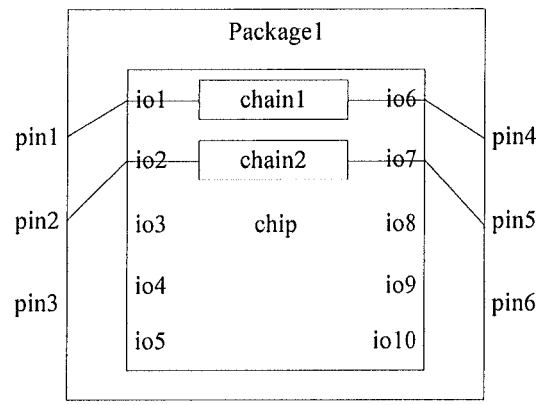
FIG. 2D is a schematic view illustrating a structure of a scan chain for a chip shown in FIGS. 2A, 2B and 2C in the prior art.
Figure 3:
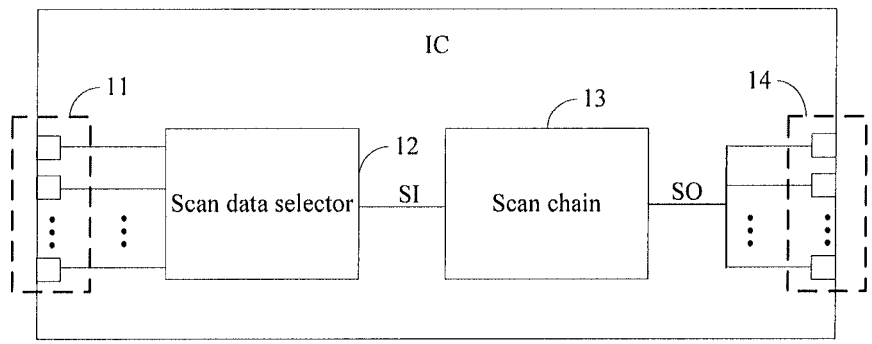
FIG. 3 is a block diagram illustrating a structure of an IC having a scan chain according to a first embodiment of the present invention.

FIG. 3 illustrates a structure of an IC having a scan chain according to a first embodiment of the present invention; and for convenience of description, only parts related to the embodiment of the present invention are shown.

The IC having a scan chain 13 comprises a first interface group 11, a second interface group 14 and a scan data selector 12. The scan chain 13 comprises a scan data input terminal, a scan data output terminal, a scan clock input terminal and a scan enable input terminal.

The first interface group 11 and the second interface group 14 each comprise at least two input/output (I/O) interfaces which can be packaged as external pins of the IC. The I/O interfaces of the first interface group 11 are connected to input terminals of the scan data selector 12 in one-to-one correspondence, and an output terminal of the scan data selector 12 is connected to the scan data input terminal SI of the scan chain 13. The scan data output terminal SO of the scan chain 13 is connected to the I/O interfaces of the second interface group 14.

The scan data selector 12, according to a package type indicating signal inputted to a control terminal (not shown) thereof, selects data in one of the I/O interfaces of the first interface group 11 that corresponds to the package type indicating signal for output to the scan data input terminal SI of the scan chain 13.

The package type indicating signal indicates a package type of the IC.

The IC of this embodiment of the present invention may be packaged in different types. In each package type, at least one of the I/O interfaces of the first interface group 11 is packaged as an external pin, and at least one of the I/O interfaces of the second interface group 14 is packaged as an external pin.

Figure 4:
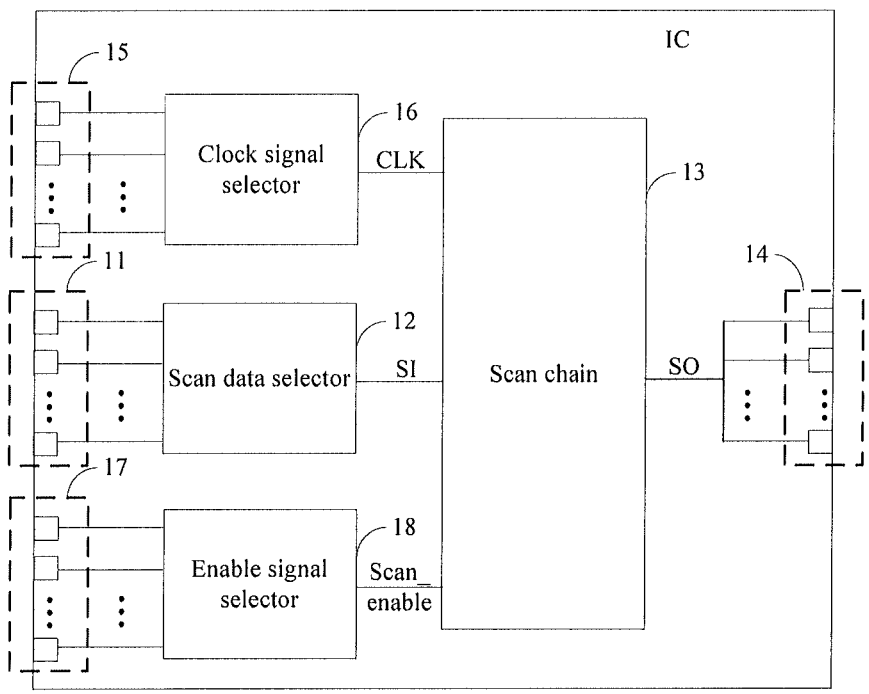
FIG. 4 is a block diagram illustrating a structure of an IC having a scan chain according to a second embodiment of the present invention.

FIG. 4 illustrates a structure of an IC having a scan chain according to a second embodiment of the present invention; and for convenience of description, only parts related to the embodiment of the present invention are shown.

As compared to the IC shown in FIG. 3, this IC additionally comprises a clock interface group 15 and a clock signal selector 16.

The clock interface group 15 comprises at least two I/O interfaces that can be packaged as external pins of the IC. The I/O interfaces of the clock interface group 15 are connected to input terminals of the clock signal selector 16 in one-to-one correspondence, and an output terminal of the clock signal selector 16 is connected to the scan clock input terminal CLK of the scan chain 13.

The clock signal selector 16, according to a package type indicating signal inputted to a control terminal (not shown) thereof, selects a clock signal in one of the I/O interfaces of the clock interface group 15 that corresponds to the package type indicating signal for output to the scan clock input terminal of the scan chain 13.

In this embodiment of the present invention, in each package type of the IC, at least one of the I/O interfaces of the clock interface group 15 is packaged as an external pin.

Further, the IC of this embodiment may additionally comprise an enable interface group 17 and an enable signal selector 18.

The enable interface group 17 comprises at least two I/O interfaces that can be packaged as external pins of the IC. The I/O interfaces of the enable interface group 17 are connected to input terminals of the enable signal selector 18 in one-to-one correspondence, and an output terminal of the enable signal selector 18 is connected to the scan enable input terminal Scan_enable of the scan chain 13.

The enable signal selector 18, according to a package type indicating signal inputted to a control terminal (not shown) thereof, selects an enable signal in one of the I/O interfaces of the enable interface group 17 that corresponds to the package type indicating signal for output to the scan enable input terminal of the scan chain 13.

In this embodiment of the present invention, in each package type of the IC, at least one of the I/O interfaces of the enable interface group 17 is packaged as an external pin.

Hereinafter, the IC having a scan chain according to this embodiment of the present invention will be described in detail with reference to a specific example.

Figure 5A:
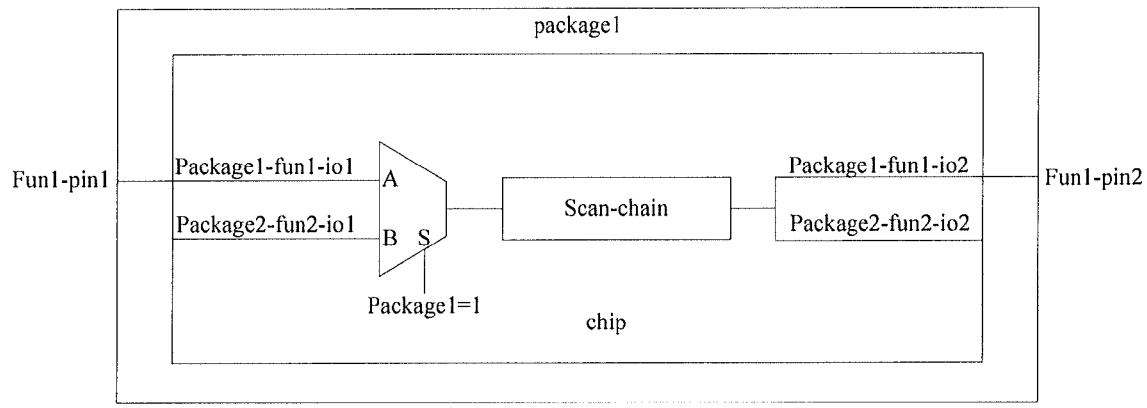
FIGS. 5A and 5B are schematic views illustrating structures of the IC having a scan chain according to the embodiment of the present invention when being packaged in a package 1 type and a package 2 type.

Referring to FIG. 5A, there is shown a structure of the IC having a scan chain according to the embodiment of the present invention when being packaged in a package 1 type, which will be detailed as follows.

In the package 1 type, the I/O interface package1_fun1_io1 of the first interface group is packaged as an external pin fun1_pin1, and the I/O interface package1_fun1_io2 of the second interface group is packaged as an external pin fun1_pin2. Then, a scan test is carried out on the IC having a scan chain according to the embodiment of the present invention in the following process.

Usable pins of the scan chain (scan chain) are fun1_pin1 and fun1_pin2. Because the I/O interface package1_fun1_io1 of the first interface group is packaged as the external pin fun1_pin1 in the package 1 type, the scan data selector 12, under the control of the package type indicating signal inputted to the control terminal thereof, selects data in the I/O interface package1_fun1_io1 of the first interface group for output to the scan data input terminal of the scan chain. Thereby, the data inputted from the external pin fun1_pin1 is used as a scan data input signal of the scan chain scan chain in the package 1 type. The output of the scan chain scan_chain is transmitted to the I/O interfaces package_fun1_io2 and package2_fun2_io2 of the second interface group. Because the I/O interface package1_fun1_io2 of the second interface group is packaged as the external pin fun1_pin2 in the package 1 type, the data transmitted to the I/O interface package 1_fun1_io2 of the second interface group can be outputted through the external pin fun1_pin2 so that an output signal of the scan chain scan_chain is obtained by the testing personnel.

Figure 5B:
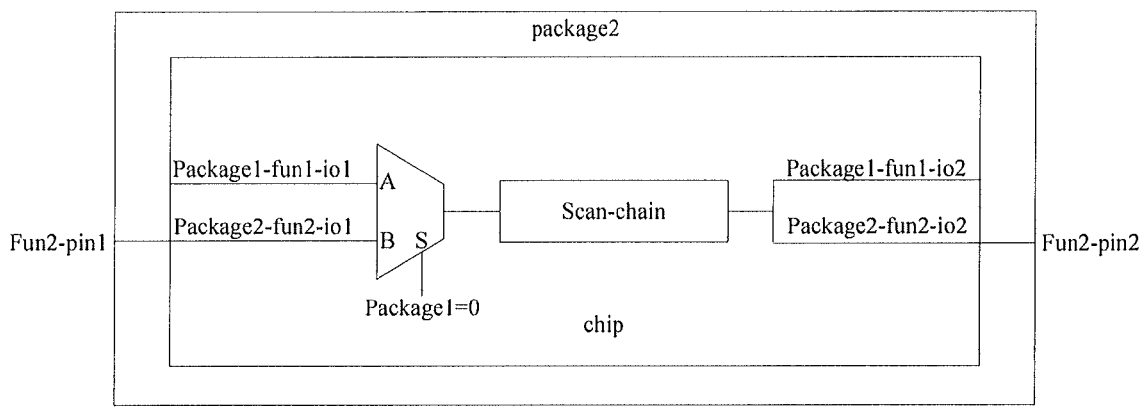

Referring to FIG. 5B, there is shown a structure of the IC having a scan chain according to the embodiment of the present invention when being packaged in a package 2 type, which will be detailed as follows.

In the package 2 type, the I/O interface package2_fun2_io1 of the first interface group is packaged as an external pin fun2_pin1, and the I/O interface package2_ fun2_io2 of the second interface group is packaged as an external pin fun2_pin2. Then, a scan test is carried out on the IC having a scan chain according to the embodiment of the present invention in the following process.

Figure 6:
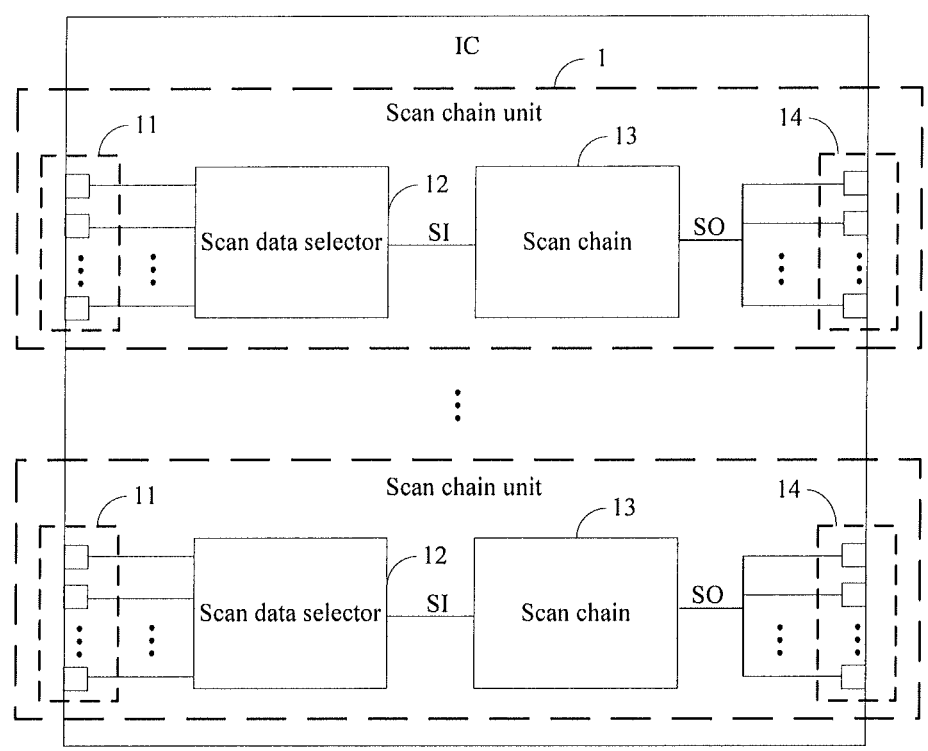
FIG. 6 is a block diagram illustrating a structure of an IC having a scan chain according to a third embodiment of the present invention.

Usable pins of the scan chain (scan_chain) are fun2_pin1 and fun2_pin2. Because the I/O interface package2_fun2_io1 of the first interface group is packaged as the external pin fun2_pin1 in the package 2 type, the scan data selector 12, under the control of the package type indicating signal inputted to the control terminal thereof, selects data in the I/O interface package2_fun2_io1 of the first interface group for output to the scan data input terminal of the scan chain 13. Thereby, the data inputted from the external pin fun2_pin1 is used as a scan data input signal of the scan chain scan_chain in the package 2 type. The output of the scan chain scan_chain is transmitted to the I/O interfaces package1_fun1_io2 and package2_fun2_io2 of the second interface group. Because the I/O interface package2_fun2_io2 of the second interface group is packaged as the external pin fun2_pin2 in the package 2 type, the data transmitted to the I/O interface package2_fun2_io2 of the second interface group can be outputted through the external pin fun2_pin2 so that an output signal of the scan chain scan_chain is obtained by a testing person. FIG. 6 illustrates a structure of an IC having a scan chain according to a third embodiment of the present invention; and for convenience of description, only parts related to the embodiment of the present invention are shown.

The IC having a scan chain comprises a plurality of scan chain units 1, each of which comprises a first interface group 11, a second interface group 14, a scan chain 13 and a scan data selector 12. The scan chain 13 comprises a scan data input terminal, a scan data output terminal, a scan clock input terminal and a scan enable input terminal.

The first interface group 11 and the second interface group 14 each comprise at least two I/O interfaces which can be packaged as external pins of the IC. The I/O interfaces of the first interface group 11 are connected to input terminals of the scan data selector 12 in one-to-one correspondence, and an output terminal of the scan data selector 12 is connected to the scan data input terminal SI of the scan chain 13. The scan data output terminal SO of the scan chain 13 is connected to the I/O interfaces of the second interface group 14.

The scan data selector 12, according to a package type indicating signal inputted to a control terminal (not shown) thereof, selects data in one of the I/O interfaces of the first interface group 11 that corresponds to the package type indicating signal for output to the scan data input terminal SI of the scan chain 13.

The package type indicating signal indicates a package type of the IC.

The IC of this embodiment of the present invention may be packaged in different types. In each package type, at least one of the I/O interfaces of each first interface group 11 is packaged as an external pin, and at least one of the I/O interfaces of each second interface group 14 is packaged as an external pin.

In this embodiment of the present invention, the number of the I/O interfaces in the first interface group may be the same or different for each of the scan chain units 1, and the number of the I/O interfaces in the second interface group may be the same or different for each of the scan chain units 1.

Figure 7:
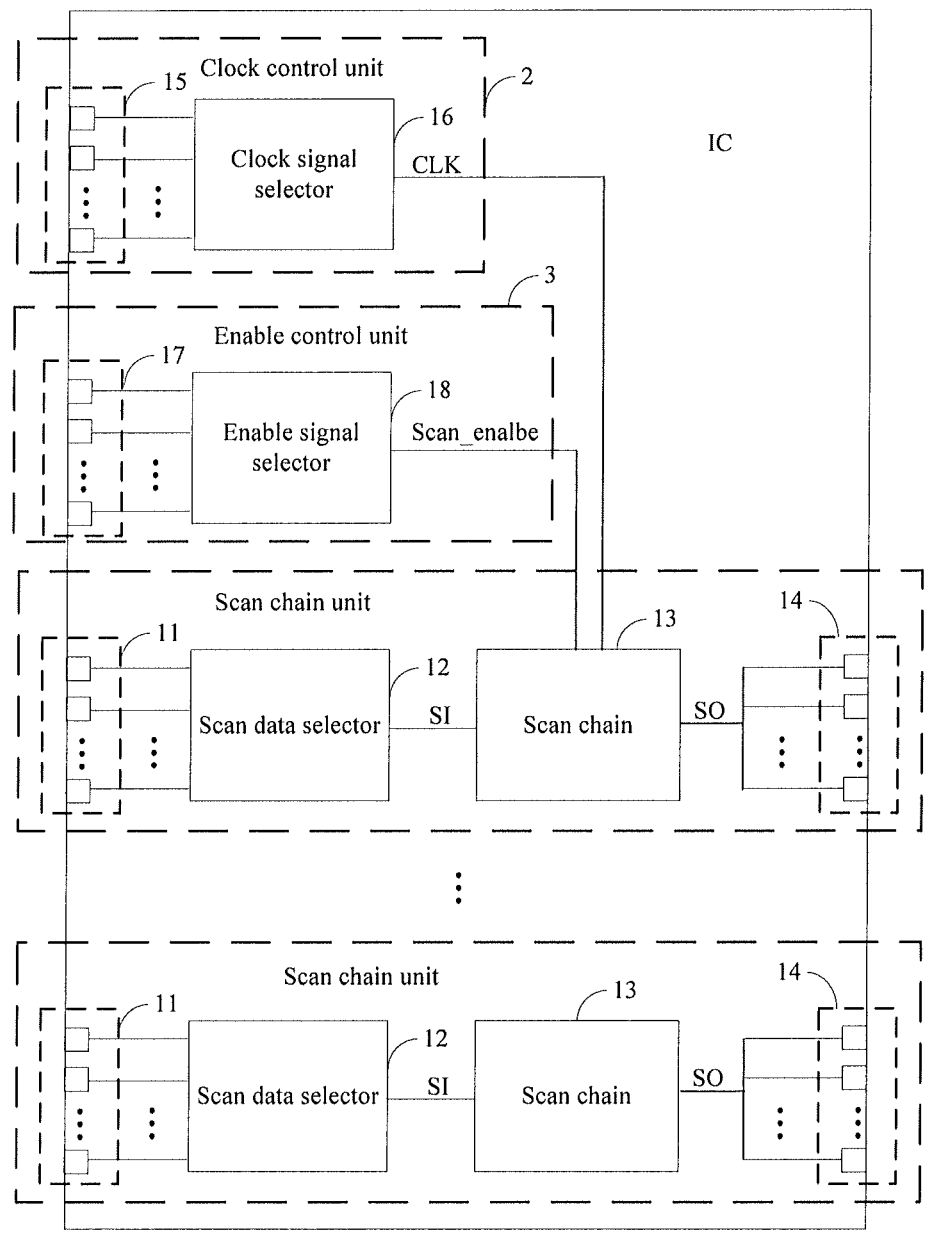
FIG. 7 is a block diagram illustrating a structure of an IC having a scan chain according to a fourth embodiment of the present invention.

FIG. 7 illustrates a structure of an IC having a scan chain according to a fourth embodiment of the present invention; and for convenience of description, only parts related to the embodiment of the present invention are shown.

As compared to the IC shown in FIG. 6, this IC additionally comprises a clock control unit 2, which comprises a clock interface group 15 and a clock signal selector 16.

The clock interface group 15 comprises at least two I/O interfaces that can be packaged as external pins of the IC. The I/O interfaces of the clock interface group 15 are connected to input terminals of the clock signal selector 16 in one-to-one correspondence, and an output terminal of the clock signal selector 16 is connected to the scan clock input terminal CLK of the scan chain 13.

The clock signal selector 16, according to a package type indicating signal inputted to a control terminal (not shown) thereof, selects a clock signal in one of the I/O interfaces of the clock interface group 15 that corresponds to the package type indicating signal for output to the scan clock input terminal of the scan chain 13.

Further, the IC shown in FIG. 7 may additionally comprise an enable control unit 3 which comprises an enable interface group 17 and an enable signal selector 18.

The enable interface group 17 comprises at least two I/O interfaces that can be packaged as external pins of the IC. The I/O interfaces of the enable interface group 17 are connected to input terminals of the enable signal selector 18 in one-to-one correspondence, and an output terminal of the enable signal selector 18 is connected to the scan enable input terminal Scan_enable of the scan chain 13.

The enable signal selector 18, according to a package type indicating signal inputted to a control terminal (not shown) thereof, selects an enable signal in one of the I/O interfaces of the enable interface group 17 that corresponds to the package type indicating signal for output to the scan enable input terminal of the scan chain 13.

Figure 8:
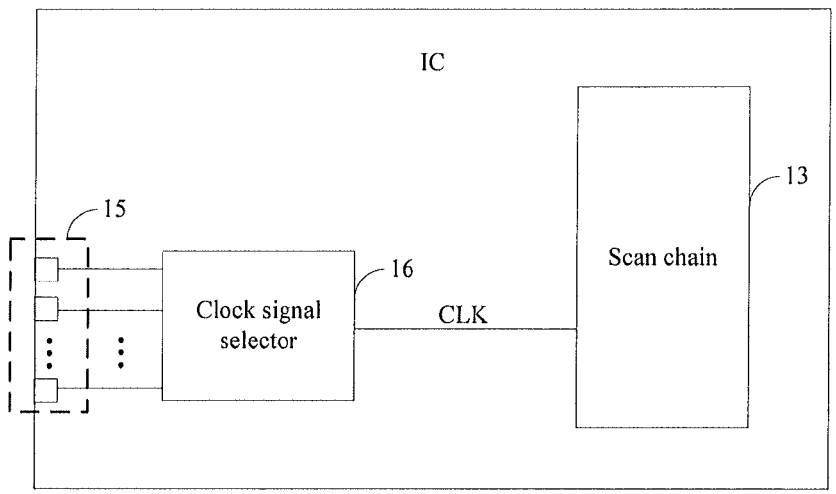
FIG. 8 is a block diagram illustrating a structure of an IC having a scan chain according to a fifth embodiment of the present invention.

FIG. 8 illustrates a structure of an IC having a scan chain according to a fifth embodiment of the present invention; and for convenience of description, only parts related to the embodiment of the present invention are shown.

The IC having a scan chain further comprises a clock interface group 15 and a clock signal selector 16. The scan chain 13 comprises a scan clock input terminal, a scan data input terminal, a scan data output terminal and a scan enable input terminal.

The clock interface group 15 comprises at least two I/O interfaces that can be packaged as external pins of the IC. The I/O interfaces of the clock interface group 15 are connected to input terminals of the clock signal selector 16 in one-to-one correspondence, and an output terminal of the clock signal selector 16 is connected to the scan clock input terminal CLK of the scan chain 13.

The clock signal selector 16, according to a package type indicating signal inputted to a control terminal (not shown) thereof, selects a clock signal in one of the I/O interfaces of the clock interface group 15 that corresponds to the package type indicating signal for output to the scan clock input terminal of the scan chain 13.

The IC of this embodiment of the present invention may be packaged in different types. In each package type, at least one of the I/O interfaces of the clock interface group 15 is packaged as an external pin.

In another embodiment of the present invention, the IC shown in FIG. 8 additionally comprises an enable interface group 17 and an enable signal selector 18. The scan chain 13 further comprises a scan enable input terminal, a scan data input terminal, a scan data output terminal and a scan clock input terminal.

The enable interface group 17 comprises at least two I/O interfaces that can be packaged as external pins of the IC. The I/O interfaces of the enable interface group 17 are connected to input terminals of the enable signal selector 18 in one-to-one correspondence, and an output terminal of the enable signal selector 18 is connected to the scan enable input terminal of the scan chain 13.

The enable signal selector 18, according to a package type indicating signal inputted to a control terminal (not shown) thereof, selects an enable signal in one of the I/O interfaces of the enable interface group 17 that corresponds to the package type indicating signal for output to the scan enable input terminal of the scan chain 13.

In this embodiment of the present invention, in each package type of the IC, at least one of the I/O interfaces of the enable interface group 17 is packaged as an external pin.

Figure 9:
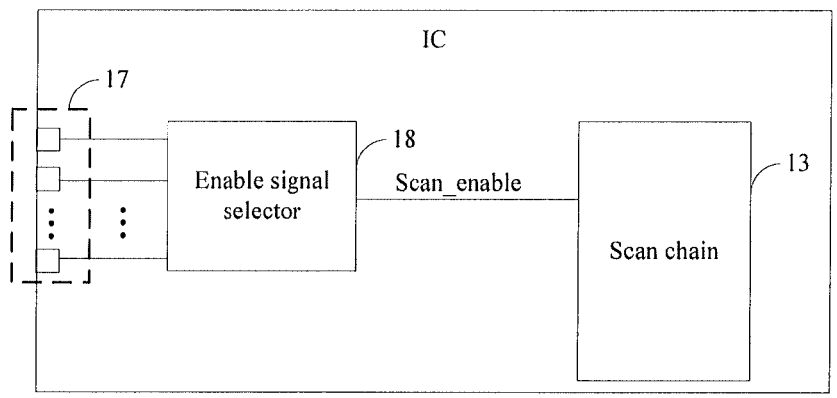
FIG. 9 is a block diagram illustrating a structure of an IC having a scan chain according to a sixth embodiment of the present invention.

FIG. 9 illustrates a structure of an IC having a scan chain according to a sixth embodiment of the present invention; and for convenience of description, only parts related to the embodiment of the present invention are shown.

The IC having a scan chain further comprises an enable interface group 17 and an enable signal selector 18. The scan chain 13 comprises a scan enable input terminal, a scan data input terminal, a scan data output terminal and a scan clock input terminal.

The enable interface group 17 comprises at least two I/O interfaces that can be packaged as external pins of the IC. The I/O interfaces of the enable interface group 17 are connected to input terminals of the enable signal selector 18 in one-to-one correspondence, and an output terminal of the enable signal selector 18 is connected to the scan enable input terminal Scan_enable of the scan chain 13.

The enable signal selector 18, according to a package type indicating signal inputted to a control terminal (not shown) thereof, selects an enable signal in one of the I/O interfaces of the enable interface group 17 that corresponds to the package type indicating signal for output to the scan enable input terminal of the scan chain 13.

In this embodiment of the present invention, in each package type of the IC, at least one of the I/O interfaces of the enable interface group 17 is packaged as an external pin.

Figure 10A:
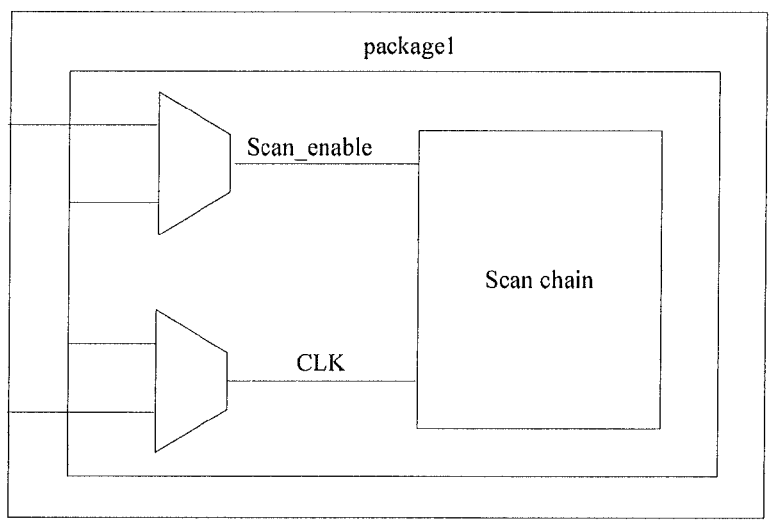
FIGS. 10A and 10B are schematic views illustrating structures of the IC having a scan chain according to the embodiment of the present invention when being packaged in the package 1 type and the package 2 type.
Figure 10B:
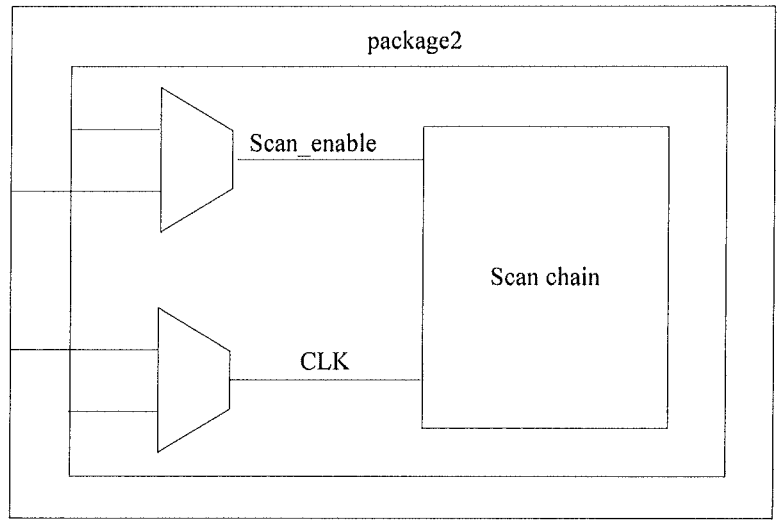

FIGS. 10A and 10B are schematic views illustrating structures of the IC having a scan chain according to the embodiment of the present invention when being packaged in the package 1 type and the package 2 type.

Figure 11:
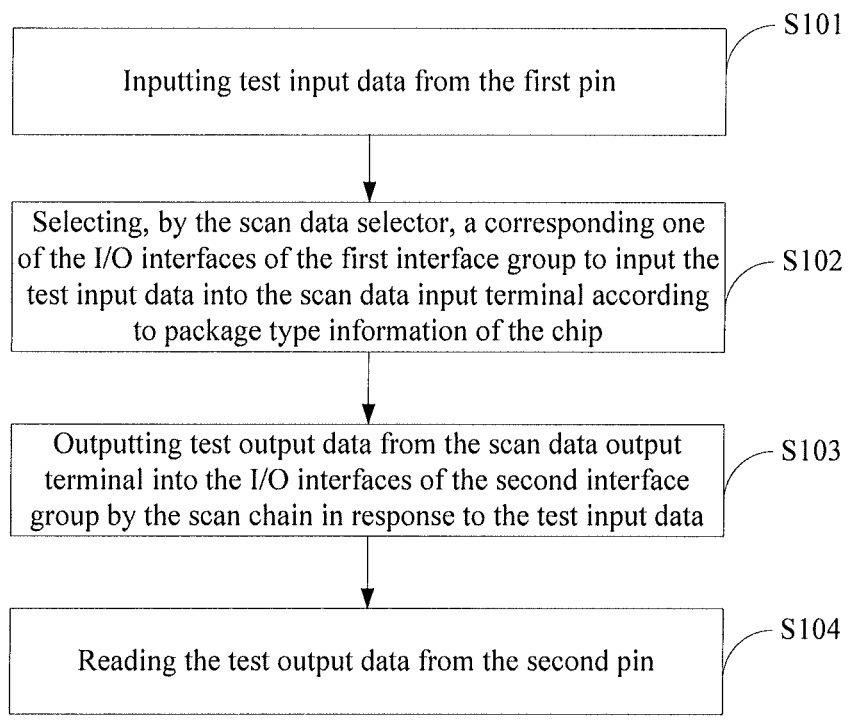
FIG. 11 is a flowchart of a testing method for a chip according to an embodiment of the present invention.

FIG. 11 illustrates a flowchart of a testing method for a chip according to an embodiment of the present invention. The chip comprises a first pin, a second pin, a scan chain, a first interface group, a second interface group and a scan data selector.

The first interface group and the second interface group each comprise at least two I/O interfaces, one of the I/O interfaces of the first interface group is connected to the first pin, and one of the I/O interfaces of the second interface group is connected to the second pin. The I/O interfaces of the first interface group are connected to input terminals of the scan data selector in one-to-one correspondence, an output terminal of the scan data selector is connected to a scan data input terminal of the scan chain, and a scan data output terminal of the scan chain is connected to the I/O interfaces of the second interface group.

The flow process of the testing method will be detailed as follows:

step S101: inputting test input data from the first pin;

step S102: selecting, by the scan data selector, a corresponding one of the I/O interfaces of the first interface group to input the test input data into the scan data input terminal according to package type information of the chip;

step S103: outputting test output data from the scan data output terminal to the I/O interfaces of the second interface group by the scan chain in response to the test input data;

step S104: reading the test output data from the second pin.

The IC having a scan chain according to embodiments of the present invention is particularly suitable for a single-core chip that can be packaged in a plurality of package types. In particular, when functions of the different package types of the single-core chip vary greatly from each other, this can considerably increase the number of scan chains so as to reduce the number of registers in each scan chain. Thus, the testing cost and the testing time for the chip can be considerably reduced to increase the testing efficiency for the chip.

In the embodiments of the present invention, the scan data selector, according to a package type indicating signal inputted to a control terminal thereof, selects data in one of the I/O interfaces of the first interface group that corresponds to the package type indicating signal for output to the I/O interfaces of the second interface group. Thereby, in different package types of the IC, I/O interfaces that are correspondingly packaged can always be used as usable pins of the scan chain. This can considerably increase the number of scan chains in the IC and reduce the number of registers in a single scan chain, thereby considerably reducing the testing cost for the IC and increasing the testing efficiency for the IC. In addition, the scan clock signal and the scan enable signal of the scan chain of the IC in different package types can be controlled flexibly.

What described above are only preferred embodiments of the present invention, but are not intended to limit the present invention. Any modifications, equivalent substitutions and improvements made within the spirit and principle of the present invention shall be all covered within the scope of the present invention.

The invention claimed is:

1. An integrated circuit (IC) having a scan chain, further comprising a first interface group, a second interface group and a scan data selector;
    the first interface group and the second interface group each comprise at least two input/output (I/O) interfaces which can be packaged as external pins of the IC;
    the I/O interfaces of the first interface group are connected to input terminals of the scan data selector in one-to-one correspondence, and an output terminal of the scan data selector is connected to a scan data input terminal of the scan chair;
    a scan data output terminal of the scan chain is directly connected to the I/O interfaces of the second interface group; and
    the scan data selector is configured to, according to a package type indicating signal inputted to a control terminal thereof, select data in one of the I/O interfaces of the first interface group that corresponds to the package type indicating signal for output to the scan data input terminal,
    wherein in each package type of the IC, at least one of the I/O interfaces of the first interface group is packaged as an external pin, and at least one of the I/O interfaces of the second interface group is packaged as an external pin.

2. The IC of claim 1, further comprising a clock interface group and as clock signal selector;
    the clock interface group comprises at least two I/O interfaces that can be packaged as external pins of the IC;
    the I/O interfaces of the dock interface group are connected to input terminals of the clock signal selector in one-to-one correspondence, and an output terminal of the clock signal selector is connected to a scan clock input terminal of the scan chain; and
    the clock signal selector is configured to, according to a package type indicating signal inputted to a control terminal thereof, select a clock signal in one of the I/O interfaces of the clock interface group that corresponds to the package type indicating signal for output to the scan clock input terminal of the scan chain.

3. The IC of claim 1, further comprising an enable interface group and an enable signal selector;
    the enable interface group comprises at least two I/O interfaces that can be packaged as external pins of the IC;
    the I/O interfaces of the enable interface group are connected to input terminals of the enable signal selector in one-to-one correspondence, and an output terminal of the enable signal selector is connected to a scan enable input terminal of the scan chain; and the enable signal selector is configured to, according to a package type indicating signal inputted to a control terminal thereof, select an enable signal in one of the I/O interfaces of the enable interface group that corresponds to the package type indicating signal for output to the scan enable input terminal of the scan chain.

4. The IC of claim 2, further comprising an enable interface group and an enable signal selector;
the enable interface group comprises at least two I/O interfaces that can be packaged as external pins of the IC;
the I/O interfaces of the enable interface group are connected to input terminals of the enable signal selector in one-to-one correspondence, and an output terminal of the enable signal selector is connected to a scan enable input terminal of the scan chain; and
the enable signal selector is configured to, according to a package type indicating signal inputted to a control terminal thereof, select an enable signal in one of the I/O interfaces of the enable interface group that corresponds to the package type indicating signal for output to the scan enable input terminal of the scan chain.

5. An IC having a scan chain, comprising a plurality of scan chain units, each of which comprises a first interface group, a second interface group, a scan chain and a scan data selector;
the first interface group and the second interface group each comprise at least two I/O interfaces which can be packaged as external pins of the IC;
the I/O interfaces of the first interface group are connected to input terminals of the scan data selector in one-to-one correspondence, and an output terminal of the scan data selector is connected to a scan data input terminal of the scan chain;
a scan data output terminal of the scan chain is directly connected to the I/O interfaces of the second interface group; and
the scan data selector is configured to, according to a package type indicating signal inputted to a control terminal thereof, select data in one of the I/O interfaces of the first interface group that corresponds to the package type indicating signal for output,
wherein in each package type of the IC, at least one of the I/O interfaces of the first interface group is packaged as an external pin, and at least one of the I/O interfaces of the second interface group is packaged as an external pin.

6. The IC of claim 5, further comprising a clock control unit which comprises a clock interface group and a clock signal selector;
the clock interface group comprises at least two I/O interfaces that can be packaged as external pins of the IC;
the I/O interfaces of the clock interface group are connected to input terminals of the clock signal selector in one-to-one correspondence, and an output terminal of the clock signal selector is connected to a scan clock input terminal of the scan chain; and
the clock signal selector is configured to, according to a package type indicating signal inputted to a control terminal thereof, select a clock signal in one of the I/O interfaces of the dock interface group that corresponds to the package type indicating signal for output to the scan dock input terminal of the scan chain.

7. The IC of claim 5, further comprising an enable control unit which comprises an enable interface group and an enable signal selector;
the enable interface group comprises at least two I/O interfaces that can be packaged as external pins of the IC;
the I/O interfaces of the enable interface group are connected to input terminals of the enable signal selector in one-to-one correspondence, and an output terminal oldie enable signal selector is connected to a scan enable input terminal of the scan chain; and
the enable signal selector is configured to, according to a package type indicating signal inputted to a control terminal thereof, select an enable signal in one of the I/O interfaces of the enable interface group that corresponds to the package type indicating signal for output to the scan enable input terminal of the scan chain.

8. The IC of claim 6, further comprising an enable control unit which comprises an enable interface group and an enable signal selector;
the enable interface group comprises at least two I/O interfaces that can be packaged as external pins of the IC;
the I/O interfaces of the enable interface group are connected to input terminals of the enable signal selector in one-to-one correspondence, and an output terminal of the enable signal selector is connected to a scan enable input terminal of the scan chain; and
the enable signal selector is configured to according to a package type indicating signal inputted to a control terminal thereof, select an enable signal in one of the I/O interfaces of the enable interface group that corresponds to the package type indicating signal for output to the scan enable input terminal of the scan chain.

9. The IC of claim 5, wherein the number of the I/O interfaces in the first interface group is the same or different for each of the scan chain units, and the number of the I/O interlaces in the second interface group is the same or different for each of the scan chain units.

10. The IC of claim 6, wherein the number of the I/O interfaces in the first interface group is the same or different for each of the scan chain units, and the number of the interfaces in the second interface group is the same or different for each of the scan chain units.

11. A testing method for a chip, wherein the chip comprises a first pin, a second pin, a scan chain, a first interface group, a second interface group and a scan data selector, the first interface, group and the second interface group each comprise at least two I/O interfaces, one of the ISO interfaces of the first interface group is connected to the first pin, and one of the ISO interfaces of the second interface group is connected to the second pin;
the ISO interfaces of the first interface group are connected to input terminals of the scan data selector in one-to-one correspondence, an output terminal of the scan data selector is connected to a scan data input terminal of the scan chain, and a scan data output terminal of the scan chain is directly connected to the ISO interfaces of the second interface group,
wherein in each package type of the IC, at least one of the ISO interfaces of the first interface group is packaged as an external pin, and at least one of the I/O interfaces of the second interface group is packaged as an external pin;
the testing method comprises:
inputting test input data from the first pin;
selecting, by the scan data selector, the test input data for input into the scan data input terminal according to package type information of the chip;
outputting test output data from the scan data output terminal by the scan chain in response to the test input data; and
reading the test output data from the second pin.

* * * * *